US010802078B2

(12) United States Patent
Tamegai et al.

(10) Patent No.: US 10,802,078 B2
(45) Date of Patent: Oct. 13, 2020

(54) CURRENT MONITORING CIRCUIT AND COULOMB COUNTER CIRCUIT

(71) Applicant: ROHM CO., LTD., Kyoto-shi, Kyoto (JP)

(72) Inventors: Yoichi Tamegai, Kyoto (JP); Takahiro Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 2 days.

(21) Appl. No.: 16/016,948

(22) Filed: Jun. 25, 2018

(65) Prior Publication Data

US 2018/0306866 A1    Oct. 25, 2018

Related U.S. Application Data

(63) Continuation of application No. PCT/JP2016/087017, filed on Dec. 13, 2016.

(30) Foreign Application Priority Data

Dec. 25, 2015 (JP) ................................ 2015-254126
Dec. 25, 2015 (JP) ................................ 2015-254127

(51) Int. Cl.
*H02J 7/04* (2006.01)
*H02J 7/16* (2006.01)
(Continued)

(52) U.S. Cl.
CPC ... *G01R 31/3842* (2019.01); *G01R 19/16542* (2013.01); *G01R 31/3648* (2013.01);
(Continued)

(58) Field of Classification Search
CPC .................................................. G01R 31/3842
(Continued)

(56) References Cited

U.S. PATENT DOCUMENTS 8,219,333 B2 *   7/2012   Li .......................... B60L 3/0046
                                                    702/63
2003/0160593 A1 *  8/2003  Yau ....................... H02J 7/0018
                                                    320/116
(Continued)

FOREIGN PATENT DOCUMENTS

JP          05323001 A     12/1993
JP       2007139700 A      6/2007
(Continued)

OTHER PUBLICATIONS

International Search Report corresponding to Application No. PCT/JP2016/087017; dated Jan. 24, 2017.
(Continued)

*Primary Examiner* — Yalkew Fantu
(74) *Attorney, Agent, or Firm* — Cantor Colburn LLP

(57) ABSTRACT

Multiple voltage monitoring circuits each detect the voltage across at least one corresponding cell from among multiple cells. A current monitoring circuit detects the current that flows through the multiple cells. When the length of a period during which the current that flows through the multiple cells is substantially zero exceeds a predetermined judgment time, the current monitoring circuit asserts a detection signal. Upon detecting an assertion of the detection signal, each voltage monitoring circuit measures the voltage across at least one corresponding cell.

15 Claims, 11 Drawing Sheets

(51) Int. Cl.
*G01R 31/3842* (2019.01)
*G01R 31/387* (2019.01)
*H01M 10/48* (2006.01)
*G01R 31/396* (2019.01)
*G01R 19/165* (2006.01)
*G01R 31/36* (2020.01)
*H01M 10/42* (2006.01)
*H02J 7/00* (2006.01)

(52) U.S. Cl.
CPC ......... *G01R 31/387* (2019.01); *G01R 31/396* (2019.01); *H01M 10/425* (2013.01); *H01M 10/482* (2013.01); *H01M 10/486* (2013.01); *H02J 7/0021* (2013.01); *H01M 2010/4271* (2013.01); *H02J 7/0048* (2020.01)

(58) Field of Classification Search
USPC ........................................................ 320/149
See application file for complete search history.

(56) References Cited

U.S. PATENT DOCUMENTS

| | | | | |
|---|---|---|---|---|
| 2005/0127873 | A1* | 6/2005 | Yamamoto | H02J 7/0016 320/116 |
| 2013/0057290 | A1* | 3/2013 | Hong | H01M 10/48 324/427 |
| 2015/0311736 | A1* | 10/2015 | Park | B60L 58/16 320/104 |

FOREIGN PATENT DOCUMENTS

| | | |
|---|---|---|
| JP | 2008054494 A | 3/2008 |
| JP | 2010019758 A | 1/2010 |
| JP | 2010508507 A | 3/2010 |
| JP | 2010533471 A | 10/2010 |
| JP | 2011064471 A | 3/2011 |
| JP | 2011123033 A | 6/2011 |
| JP | 2011169605 A | 9/2011 |
| JP | 2011215151 A | 10/2011 |
| JP | 2012533759 A | 12/2012 |
| JP | 2013046446 A | 3/2013 |
| JP | 2013051759 A | 3/2013 |
| JP | 2014202551 A | 10/2014 |
| JP | 2015027137 A | 2/2015 |
| JP | 2015188311 A | 10/2015 |
| WO | 2008053410 A2 | 5/2008 |
| WO | 2009007885 A1 | 1/2009 |
| WO | 2011009227 A1 | 1/2011 |
| WO | 2014162645 A1 | 10/2014 |

OTHER PUBLICATIONS

Written Opinion of the International Searching Authority with International Preliminary Report on Patentability, corresponding to Application No. PCT/JP2016/087017; dated Jan. 24, 2017.

JPO Notice of Reasons for Refusal corresponding to Application No. 2017-557893; dated May 13, 2019.

JPO Decision of Refusal Office Action for for corresponding 2017-557893 dated Jan. 7, 2020.

\* cited by examiner

300

CURRENT MONITORING CIRCUIT AND COULOMB COUNTER CIRCUIT

CROSS REFERENCE TO RELATED APPLICATIONS

This application is a bypass continuation under 35 U.S.C. § 120 of PCT/JP2016/087017, filed Dec. 13, 2016, which is incorporated herein reference and which claimed priority to Japanese Application No. 2015-254126, filed Dec. 25, 2015 and Japanese Application No. 2015-254127, filed on Dec. 25, 2015. The present application likewise claims priority under 35 U.S.C. § 119 to Japanese Application No. 2015-254126, filed Dec. 25, 2015 and Japanese Application No. 2015-254127, filed on Dec. 25, 2015, the entire content of which is also incorporated herein by reference.

BACKGROUND OF THE INVENTION

1. Field of the Invention

The present invention relates to a battery management technique.

2. Description of the Related Art

Various kinds of battery-driven electronic devices such as cellular phone terminals, digital still cameras, tablet terminals, portable music players, and portable game machines include a built-in chargeable secondary battery. Electronic circuits such as a CPU (Central Processing Unit) that supports a system control operation and signal processing, a liquid crystal panel, a wireless communication module, and other kinds of analog circuits and digital circuits each operate receiving power supplied from the secondary battery.

FIG. 1 is a block diagram showing an electronic device. An electronic device 500 includes a battery pack 502 and a charger circuit 504 that charges the battery pack 502. The charger circuit 504 receives a power supply voltage $V_{ADP}$ from an external power supply adapter or USB (Universal Serial Bus), and charges the battery pack 502.

Such a battery-driven electronic device has a function of detecting the remaining battery charge as an indispensable function. The electronic device 500 is provided with a battery fuel gauge circuit 506. The battery fuel gauge circuit 506 is also referred to as a "fuel gauge IC (Integrated Circuit)". As a detection method for detecting the remaining battery charge provided by the battery fuel gauge circuit 506, two methods, i.e., (1) the voltage method and (2) the coulomb counting method (charge integration method), have become mainstream. In some cases, the battery fuel gauge circuit 506 is built into the charger circuit 504.

In the voltage method, the open circuit voltage (OCV) of the battery is measured in an open circuit state (no-load state). The remaining battery charge is estimated based on the correspondence between the OCV and the SOC (State Of Charge). In the coulomb counting method, the charging current that flows into the battery and the discharging current that flows from the battery (which will collectively be referred to as "charging/discharging current" or otherwise "load current" hereafter) are accumulated, so as to calculate the amount of charge supplied to the battery and the amount of charge discharged from the battery, thereby estimating the remaining battery charge. With the coulomb counting method, the precision in the estimation of the remaining battery charge becomes poor over time due to error accumulation. In order to reset the error accumulation, typically, the coulomb counting method is employed together with the voltage method.

As with various kinds of consumer devices, as shown in FIG. 1, a compact-size electronic device uses a low battery voltage $V_{BAT}$ on the order of 4 V, and employs a battery pack 502 including a single cell 508. The remaining battery charge detection circuit 506 measures the OCV of the single cell 508, or otherwise measures the charging/discharging current to/from the cell 508, so as to detect the remaining battery charge of the cell 508.

As described above, in many cases, such a consumer device has only one or otherwise several cells 508. However, with a system that requires a battery voltage of several dozen V to several hundred V, the number of the cells included in the battery pack 502 is several dozen. For the overall system, there is a need to detect the SOC of each of the multiple cells, and to calculate the sum total of the detection results so as to detect the remaining battery charge of the overall battery pack 502. However, it is unrealistic to detect the SOC for the multiple cells using a single battery fuel gauge circuit 506. This is because such a battery fuel gauge circuit 506 requires a very large chip size. In addition, with such multiple cells coupled in series, the voltage difference between the electrode of a given cell on the high electric potential side and the electrode of another given cell on the low electric potential side is several dozen V to several hundred V. However, it is unrealistic to require the battery fuel gauge circuit 506 to have such a high breakdown voltage.

SUMMARY OF THE INVENTION

The present invention has been made in order to solve such a problem. Accordingly, it is an exemplary purpose of an embodiment of the present invention to provide a system that is capable of detecting the remaining battery charge of a battery pack.

1. An embodiment of the present invention relates to a battery management system. The battery management system comprises: a battery pack comprising multiple cells; multiple voltage monitoring circuits each structured to detect the voltage across at least one corresponding cell from among the multiple cells; and a current monitoring circuit structured to detect the current that flows through the multiple cells.

This embodiment employs an approach in which the multiple voltage monitoring circuits are provided such that they are associated with the multiple cells. As a comparison example, a conventional system is known, configured to include multiple fuel gauge circuits (fuel gauge ICs). In this case, each fuel gauge circuit includes a circuit block that detects the OCV of a corresponding cell and a circuit block that detects the charging/discharging current. However, a common charging/discharging current flows through each of all the cells. Accordingly, such a conventional system has redundant block circuits for detecting the charging/discharging current. In contrast, with the battery management system according to an embodiment, each voltage monitoring circuit monitors the voltage across a corresponding cell. Furthermore, a common current monitoring circuit is provided in order to detect the charging/discharging current, thereby solving a problem of circuit redundancy. In addition, in order to detect the charging/discharging current with high precision, this arrangement requires high-precision trimming (fine adjustment) or otherwise calibration (correction) in order to compensate for the temperature state or variation due to aging. Such trimming or calibration is required for only a single current monitoring circuit, thereby allowing a reduction in the manufacturing costs for the overall system.

Also, when the length of a period during which the current that flows through the multiple cells is substantially zero exceeds a predetermined judgment time, the current monitoring circuit may assert a detection signal. Also, upon detecting an assertion of the detection signal, each voltage monitoring circuit may measure the voltage across at least one corresponding cell.

In order to detect the SOC based on the OCV with high precision using the voltage method, the cell voltage must be measured when the battery is in a relaxed state. Such an arrangement requires a sufficient relaxation time after the charging/discharging current becomes zero. Typically, the relaxation time has a long time scale on the order of several dozen minutes to several hours. Accordingly, in a case in which a processor such as a microprocessor or the like supports a function of judging whether or not the relaxation time has elapsed, this arrangement does not allow the processor to have a sleep state, leading to an increase in power consumption. With an embodiment, the function of judging whether or not the relaxation time has elapsed is implemented on the current monitoring circuit. This arrangement lightens the load imposed on the processor. Alternatively, this arrangement allows the processor to have a sleep state, thereby allowing power consumption to be reduced. It should be noted that the current monitoring circuit operates at all times in order to monitor the current. Accordingly, an increase in power consumption in the current monitoring circuit is relatively small as compared with that in the processor.

Also, the current monitoring circuit may comprise: a current detection circuit structured to measure the current that flows through the multiple cells; and a timer circuit structured to measure the length of time during which the current measured by the current detection circuit is lower than a predetermined threshold value.

When the time measured by the timer circuit exceeds a judgment time, the current monitoring circuit according to an embodiment may transmit a notice to the multiple voltage monitoring circuits.

The battery management system according to an embodiment may further comprise a processor. When the time measured by the timer circuit exceeds a judgment time, the current monitoring circuit may transmit a notice to the processor. Upon reception of the notice from the current monitoring circuit, the processor may instruct the multiple voltage monitoring circuits to measure the voltage.

Also, the judgment time may be variable according to an aging state of the battery pack. Also, the judgment time may be variable according to the temperature of the battery pack. Also, the judgment time may be variable according to the state of charge (SOC) of the battery pack.

The relaxation time varies depending on the aging state, the temperature, and the state of charge of the battery pack. Accordingly, by changing the relaxation time according to such a state, this arrangement is capable of measuring the OCV with high precision.

Another embodiment of the present invention relates to a vehicle. The vehicle may be provided with the battery management system according to any one of the embodiments described above.

Yet another embodiment of the present invention relates to a current monitoring circuit. The current monitoring circuit is used for a battery management system. The battery management system comprises: a battery pack comprising multiple cells; multiple voltage monitoring circuits each structured to detect the voltage across at least one corresponding cell from among the multiple cells; and a current monitoring circuit structured to detect the current that flows through the multiple cells. The current monitoring circuit comprises: a current detection circuit structured to measure the current that flows through the multiple cells; and a timer circuit structured to measure the length of a period during which the current measured by the current detection circuit is substantially zero. When the period of time measured by the timer circuit exceeds a predetermined judgment time, the current monitoring circuit asserts a detection signal that indicates that the multiple cells are in a relaxed state.

Also, the battery management system may further comprise a processor. Also, the current monitoring circuit may further comprise an interface circuit structured to transmit and receive data to and from the processor. Also, the current monitoring circuit may be structured to transmit the detection signal to the processor via the interface circuit.

Also, the current monitoring circuit may further comprise an interface circuit structured to transmit and receive data to and from the multiple voltage monitoring circuits. Also, the current monitoring circuit may transmit the detection signal to the multiple voltage monitoring circuits via the interface circuit.

Also, the judgment time is variable according to at least one of the aging state of the battery pack, the temperature of the battery pack, and the state of charge (SOC) of the battery pack.

Yet another embodiment of the present invention relates to a vehicle. The vehicle may comprise any one of the current monitoring circuits.

Yet another embodiment of the present invention also relates to a battery management system. The battery management system comprises: a battery pack comprising multiple cells; multiple voltage monitoring circuits each structured to detect the voltage across at least one corresponding cell from among the multiple cells; and a coulomb counter circuit structured to detect the current that flows through the multiple cells, and to accumulate a charging/discharging current that flows through the multiple cells, so as to generate an accumulated coulomb count value.

This embodiment employs an approach in which the multiple voltage monitoring circuits are provided such that they are associated with the multiple cells. As a comparison example, a conventional system is known, configured to include multiple fuel gauge circuits (fuel gauge ICs). In this case, each fuel gauge circuit includes a circuit block that detects the OCV of a corresponding cell and a circuit block that detects the charging/discharging current. However, a common charging/discharging current flows through each of all the cells. Accordingly, such a conventional system has redundant block circuits for detecting the charging/discharging current. In contrast, with the battery management system according to an embodiment, each voltage monitoring circuit monitors the voltage across a corresponding cell. Furthermore, a common current monitoring circuit is provided in order to detect the charging/discharging current, thereby solving a problem of circuit redundancy. In addition, in order to detect the charging/discharging current with high precision, this arrangement requires high-precision trimming (fine adjustment) or otherwise calibration (correction) in order to compensate for the temperature state or variation due to aging. Such trimming or calibration is required for only a single current monitoring circuit, thereby allowing a reduction in the manufacturing costs for the overall system.

In a case in which a processor supports the current accumulation calculation in a software manner in the coulomb counting method, this arrangement requires the processor to be operated at all times. In contrast, in a case in which the coulomb counter circuit supports the current accumulation calculation in a hardware manner in the coulomb counting method, this arrangement allows the processor to have an increased sleep period, thereby allowing power consumption to be reduced for the overall system.

Also, the coulomb counter circuit may generate either one from among a charging coulomb count value, which is an accumulated value of the charging current that flows through the multiple cells, and a discharging coulomb count value, which is an accumulated value of the discharging current that flows through the multiple cell.

This arrangement is capable of calculating the charging cycles or otherwise the discharging cycles.

Also, the coulomb counter circuit may generate both the charging coulomb count value and the discharging coulomb count value.

This arrangement is capable of calculating both the charging cycles and the discharging cycles.

Also, the battery management system according to an embodiment may further comprise a processor. Also, the processor may generate either one from among the charging coulomb count value and the discharging coulomb count value based on a difference between (i) the accumulated coulomb count value generated by the coulomb counter circuit and (ii) the other one from among the charging coulomb count value and the discharging coulomb count value generated by the coulomb counter circuit.

By calculating either the charging coulomb count value or the discharging coulomb count value in a software manner, this arrangement allows the coulomb counter circuit to have a reduced circuit area.

Also, the battery management system according to an embodiment may further comprise a processor. Also, the processor may calculate the number of charging cycles based on the charging coulomb count value and the number of discharging cycles based on the discharging coulomb count value.

Also, the coulomb counter circuit may measure the accumulated operating time of the battery pack.

In a case in which a processor supports the measurement of the accumulated operating time in a software manner, this arrangement requires the processor to be operated at all times. In contrast, in a case in which the coulomb counter circuit supports the time measurement function in a hardware manner, this arrangement allows the processor to have an increased sleep period, thereby allowing power consumption to be reduced for the overall system.

Also, the coulomb counter circuit may count the accumulated operating time with a weighting coefficient that corresponds to the state of charge of the battery pack. This arrangement is capable of estimating the aging of the battery pack due to use with improved precision. Also, the weighting coefficient may be represented by lines that form a downwardly convex shape in relation to the state of charge.

Also, when the length of a period during which the current that flows through the multiple cells is substantially zero exceeds a predetermined judgment time, the coulomb counter circuit may assert a detection signal. Also, upon the assertion of the detection signal, each voltage monitoring circuit may measure the voltage across at least one corresponding cell.

In order to detect the SOC based on the OCV with high precision using the voltage method, the cell voltage must be measured when the battery is in a relaxed state. Such an arrangement requires a sufficient relaxation time after the charging/discharging current becomes zero. Typically, the relaxation time has a long time scale on the order of several dozen minutes to several hours. Accordingly, in a case in which a processor such as a microprocessor or the like supports a function of judging whether or not the relaxation time has elapsed, this arrangement does not allow the processor to have a sleep state, leading to an increase in power consumption. With this embodiment, the function of judging whether or not the relaxation time has elapsed is implemented on the coulomb counter circuit. This arrangement lightens the load imposed on the processor. Alternatively, this arrangement allows the processor to have a sleep state, thereby allowing power consumption to be reduced. It should be noted that the coulomb counter circuit operates at all times in order to monitor and accumulate the current. Accordingly, an increase in power consumption in the coulomb counter circuit is relatively small as compared with that in the processor.

Yet another embodiment of the present invention relates to a vehicle. The vehicle may comprise any one of the battery management systems described above.

Yet another embodiment of the present invention relates to a coulomb counter circuit. The coulomb counter circuit is used for a battery management system. In addition to the coulomb counter circuit, the battery management system comprises: a battery pack comprising multiple cells; and multiple voltage monitoring circuits each structured to detect the voltage across at least one corresponding cell from among the multiple cells. The coulomb counter circuit comprises: a current detection circuit structured to detect the current that flows through the multiple cells; and a first counter circuit structured to accumulate, with different polarities, a charging current and a discharging current detected by the current detection circuit, so as to generate an accumulated coulomb count value.

Also, the coulomb counter circuit according to an embodiment may further comprise a second counter circuit structured to generate one from among a charging coulomb count value, which is an accumulated value of the charging current detected by the current detection circuit, and a discharging coulomb count value, which is an accumulated value of the discharging current detected by the current detection circuit.

Also, the coulomb counter circuit according to an embodiment may further comprise a third counter circuit structured to generate the other one from among the charging coulomb count value and the discharging coulomb count value.

Also, the battery management system may further comprise a processor. Also, the processor may generate either one from among the charging coulomb count value and the discharging coulomb count value based on a difference between (i) the accumulated coulomb count value and (ii) the other one from among the charging coulomb count value and the discharging coulomb count value generated by the coulomb counter circuit.

Also, the coulomb counter circuit according to an embodiment may further comprise an operating time measurement circuit structured to measure an accumulated operating time of the battery pack. Also, the operating time measurement circuit may count the accumulated operating time with a weighting coefficient that corresponds to the state of charge of the battery pack. Also, the weighting coefficient may be represented by lines that form a downwardly convex shape in relation to the state of charge.

Also, the coulomb counter circuit according to an embodiment may further comprise a timer circuit structured to measure the length of a period during which the current measured by the current detection circuit is substantially zero. Also, when the time measured by the timer circuit exceeds a predetermined judgment time, the timer circuit may assert a detection signal that indicates that the multiple cells are in a relaxed state.

Yet another embodiment of the present invention relates to a battery management system. The battery management system may comprise any one of the coulomb counter circuits described above.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting a voltage signal, current signal, or resistor, also represent the corresponding voltage value, current value, or resistance value.

First Embodiment

Figure 1:
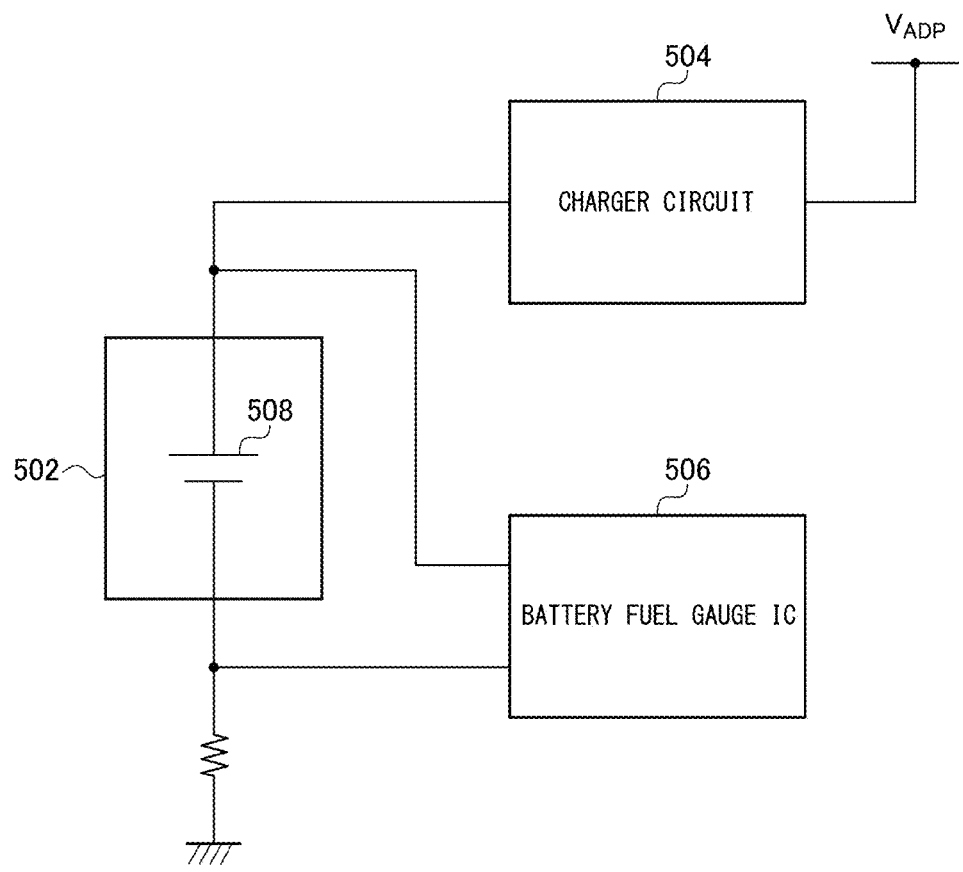
FIG. 1 is a block diagram showing an electronic device.
Figure 2:
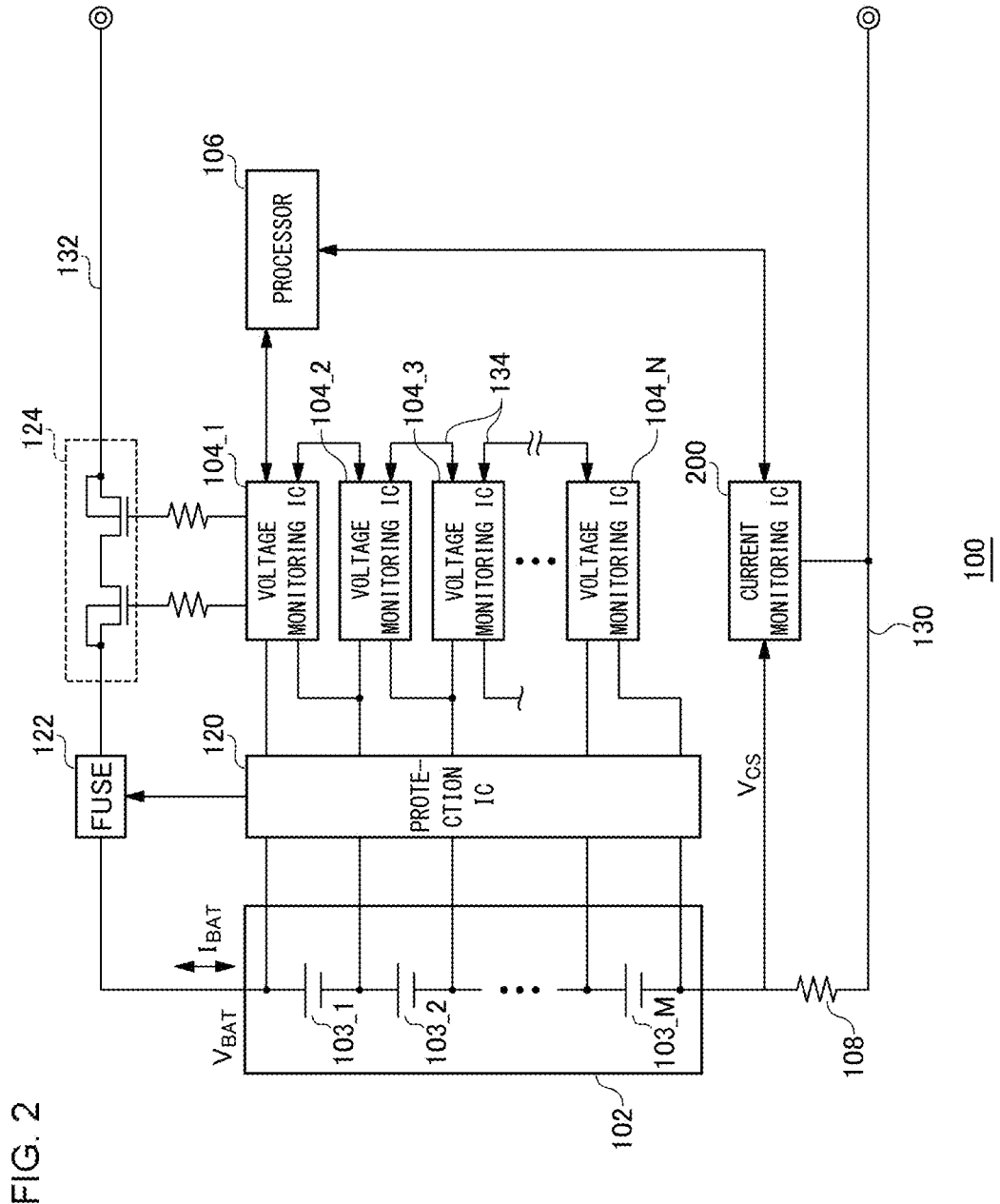
FIG. 2 is a block diagram showing a battery management system according to a first embodiment.

FIG. 2 is a block diagram showing a battery management system 100 according to a first embodiment. The battery management system 100 mainly includes a battery pack 102, multiple voltage monitoring circuits 104, a current monitoring circuit 200, and a processor 106.

The battery pack 102 includes multiple (M, which represents an integer of 2 or more) cells 103. The kind of the cells is not restricted in particular, and examples thereof include lithium-ion cells, lithium-air cells, lithium metal-based cells, nickel-metal hydride cells, nickel-cadmium cells, nickel-zinc cells, etc. The number of the cells, i.e., M, depends on the usage of the electronic device 100. In an in-vehicle battery, industrial equipment, or an industrial apparatus, the number of the cells is designed to be on the order of several dozen to several hundred. For example, in a case in which the battery voltage $V_{BAT}$ is 200 V, and each lithium-ion cell provides a cell voltage of 4 V, the number of cells, i.e., M, is designed to be 50 (=200/4). It should be noted that FIG. 2 shows an arrangement in which multiple cells 103 are coupled in series within the battery pack 102. However, the present invention is not restricted to such an arrangement. Also, several cells or groups of cells may be coupled in parallel.

The multiple (N) voltage monitoring circuits 104 are each assigned to at least a corresponding one of the multiple cells. Each voltage monitoring circuit 104 is configured to detect the voltage for at least the corresponding one cell. The voltage monitoring circuits 104 may be associated with the cells in a one-to-one manner. In this case, the relation M=N holds true. Alternatively, each single voltage monitoring circuit 104 may be configured to measure the voltage for around two or three adjacent cells. The voltage monitoring circuit 104 transmits the cell voltage values thus measured to the processor 106. For example, in the battery management system 100 shown in FIG. 2, the multiple voltage monitoring circuits 104_1 through 104_N are coupled in cascade. Furthermore, the first voltage monitoring circuit 104_1 is coupled to the processor 106. The voltage monitoring circuits 104_1 through 104_N each transmit the data that indicates the cell voltage measurement results thereof to the processor 106 via a cascade chain 134. Alternatively, the multiple voltage monitoring circuits 104_1 through 104_N may each be coupled to the processor 106.

It should be noted that the kind of interface between the voltage monitoring circuits 104 or otherwise between the voltage monitoring circuit 104 and the processor 106 is not restricted in particular. For example, an SPI (Serial Peripheral Interface) may be employed. Also, in an in-vehicle battery or industrial equipment, a CAN (Controller Area Network) may be employed as such an interface.

The current monitoring circuit 200 detects the current the that flows through the multiple cells 103, i.e., the charging/discharging current $I_{BAT}$ of the battery pack 102. For example, a sensing resistor 108 may be inserted in series with the battery pack 102. In this case, the current monitoring circuit 200 may detect the charging/discharging current $I_{BAT}$ based on the voltage drop $V_{CS}$ that occurs across the sensing resistor 108. The sensing resistor 108 may be built into the battery pack 102. In FIG. 2, the sensing resistor 108 is arranged between the negative electrode of the battery pack 102 and a negative electrode line (ground line) 130. However, the present invention is not restricted to such an arrangement. Also, the sensing resistor 108 may be arranged between the positive electrode of the battery pack 102 and a positive electrode line (battery line) 132.

The charging/discharging current $I_{BAT}$ thus measured by the current monitoring circuit 200 is used for calculation of the SOC based on the coulomb counting method. The current monitoring circuit 200 transmits the data that indicates the charging/discharging current $I_{BAT}$ thus measured, or otherwise the same data subjected to calculation processing, to the processor 106.

Figure 3A:
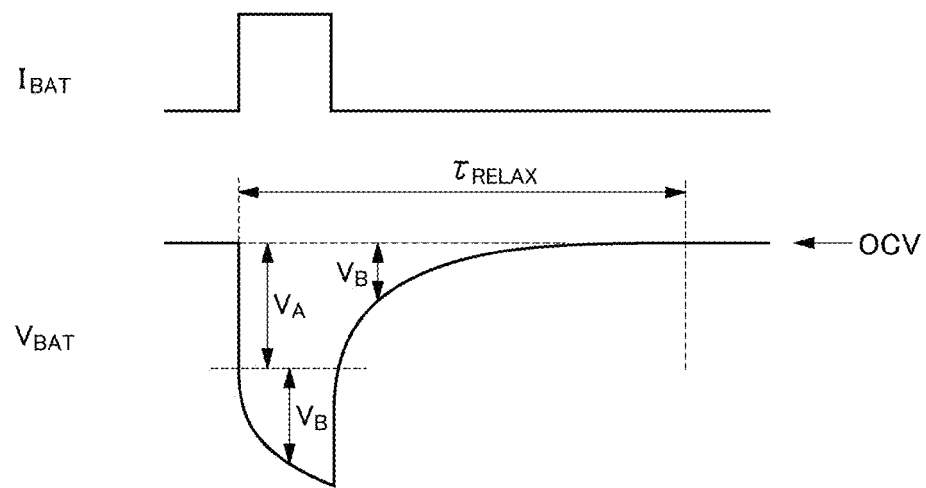
FIG. 3A and FIG. 3B are diagrams for explaining the OCV and SOC.
Figure 3B:
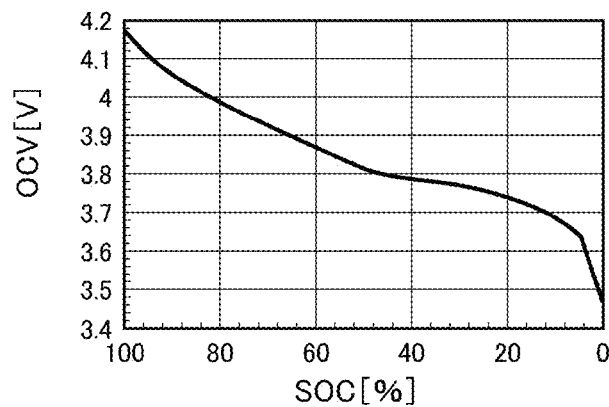

FIG. 3A and FIG. 3B are diagrams for explaining the OCV and SOC. FIG. 3A shows the relation between the charging/discharging current $I_{BAT}$ and the battery voltage $V_{BAT}$. When the positive charging/discharging current $I_{BAT}$ (i.e., discharging current) flows, the battery voltage $V_{BAT}$ drops. The voltage drop that occurs in the battery voltage $V_{BAT}$ includes a component $V_B$ that corresponds to the hysteresis of the past discharging current $I_{BAT}$ in addition to a component $V_A$ due to the instantaneous value of the discharging current $I_{BAT}$. Accordingly, the battery voltage $V_{BAT}$ cannot be restored to the initial voltage level due to the effect of the component $V_B$ immediately after the discharging current $I_{BAT}$ becomes zero, i.e., immediately after the load state transmits to the no-load state. Rather, after a sufficient relaxation time $\tau_{RELAX}$ elapses, the battery voltage is restored to the initial voltage level, i.e., the battery state is returned to the OCV state. The relaxation time $\tau_{RELAX}$ is on the order of several dozen minutes to several hours. FIG. 3B is a diagram showing the relation between the OCV and the SOC.

When the charging/discharging current $I_{BAT}$ that flows through the multiple cells 103 has continuously been substantially zero over a predetermined judgment time $\tau_{TH}$ or more, the current monitoring circuit 200 asserts the detection signal. The phrase "the charging/discharging current $I_{BAT}$ is substantially zero" means that the charging/discharging current $I_{BAT}$ is at a small level such that the multiple cells 103 can be regarded as being in a no-load state. The current monitoring circuit 200 judges whether or not the battery pack 102 is in the relaxed state. Accordingly, the judgment time $\tau_{TH}$ is a threshold time to be used for judging whether or not the battery cells are in the relaxed state. The judgment time $\tau_{TH}$ is determined to be larger than the relaxation time $\tau_{RELAX}$.

Upon detecting the assertion of the detection signal, the multiple voltage monitoring circuits 104_1 through 104_N each measure the voltage of each of at least the corresponding one cell. For example, when the detection signal is asserted, i.e., when judgment is made that the cells are in the relaxed state, the current monitoring circuit 200 transmits a notice to the processor 106. Upon reception of the notice, the processor 106 instructs the multiple voltage monitoring circuits 104_1 through 104_N to measure the cell voltage. The cell voltage thus measured is employed as the OCV.

The processor 106 integrally controls the overall operation of the battery management system 100. For example, the processor 106 is configured as a MPU (Micro-Processing Unit), a CPU (Central Processing Unit), a microcontroller, a DSP (Digital Signal Processor), a FPGA (Field Programmable Gate Array), or the like. The processor 106 receives the cell voltage values measured by the multiple voltage monitoring circuits 104, and detects the SOC of the battery pack 102 based on the voltage method. Furthermore, the processor 106 receives data relating to the charging/discharging current $I_{BAT}$ measured by the current monitoring circuit 200, and calculates the SOC based on the coulomb counting method. It should be noted that all the SOC calculation processing may be executed by the processor 106. Also, a part of the SOC calculation processing (e.g., integration processing) may be executed by the current monitoring circuit 200.

In addition, the battery management system 100 may be provided with a protection IC 120, a fuse 122, a load switch 124, etc. The protection IC 120 detects a short-circuit state of a cell, abnormal temperature, or the like, that occurs in the battery pack 102. A part of or the whole of the protection IC 102 may be built into the battery pack 102 or otherwise built into the voltage monitoring circuit 104. The fuse 122 is provided on a path of the positive electrode line 132. Upon detecting an abnormal state, the protection IC 120 may disconnect the fuse 122, or otherwise may transmit a notice to the processor 106.

The load switch 124 is also provided on a path of the positive electrode line 132, as with the fuse 122. The on/off state of the load switch 124 is controlled by the voltage monitoring circuit 104 or otherwise the processor 106.

The above is the configuration of the battery management system 100. Next, description will be made regarding the advantages thereof.

The battery management system 100 employs an approach in which the multiple voltage monitoring circuits 104 are provided such that they are associated with the multiple cells. The advantages of the battery management system 100 can be clearly understood in comparison with the comparison techniques shown in FIG. 4A and FIG. 4B. It should be noted that these comparison techniques are by no means regarded as known techniques.

Description will be made regarding a comparison technique 100R shown in FIG. 4A. The comparison technique 100R is configured as a conventional system including multiple fuel gauge circuits (fuel gauge ICs) 506. Each fuel gauge circuit 506 includes a circuit 510 configured to detect the OCV of the corresponding cell and a circuit 512 configured to detect the charging/discharging current. In a case in which the multiple cells 103 are coupled in series, a common charging/discharging current flows through each of all the cells. Accordingly, such a configuration in which the circuit 512 that detects the charging/discharging current is provided for each fuel gauge circuit 506 is redundant.

In contrast, with the battery management system 100 according to the first embodiment, each voltage monitoring circuit 104 monitors the voltage of the corresponding cell. In addition, a common current monitoring circuit 200 is provided in order to detect the charging/discharging current $I_{BAT}$. This solves a problem of a redundant circuit configuration.

Furthermore, in order to detect the charging/discharging current $I_{BAT}$ with high precision, high-precision trimming (fine adjustment) is required. With the battery management system 100R shown in FIG. 4A, such trimming is required for each fuel gauge circuit 506. In contrast, with the battery management system 100 shown in FIG. 2, such trimming is required for only a single current monitoring circuit 200. Accordingly, this arrangement allows the manufacturing cost to be reduced for the overall system.

Figure 4B:
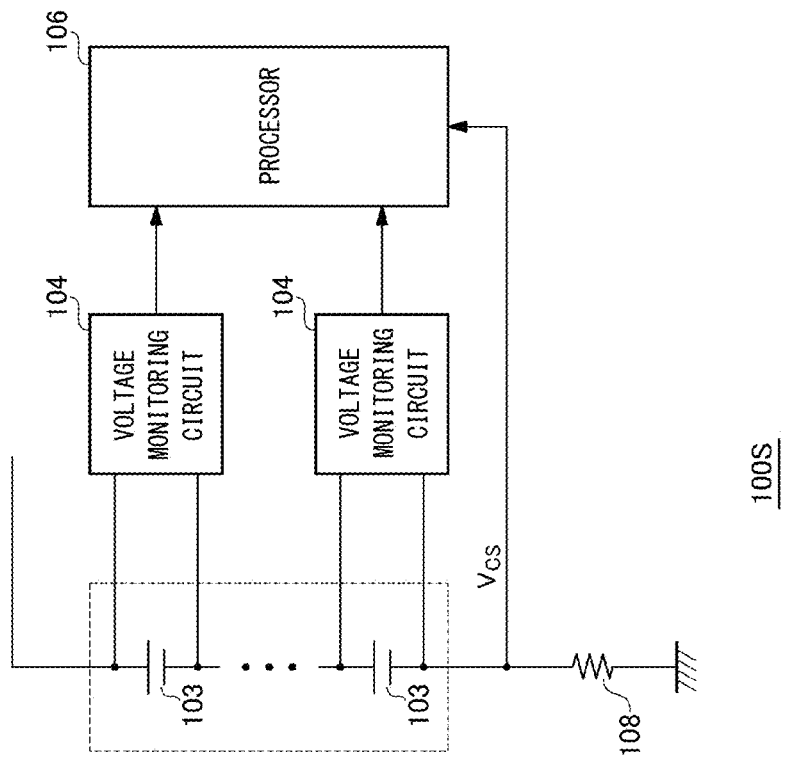
FIG. 4A and FIG. 4B are block diagrams each showing a battery management system according to a comparison technique.
Figure 4A:
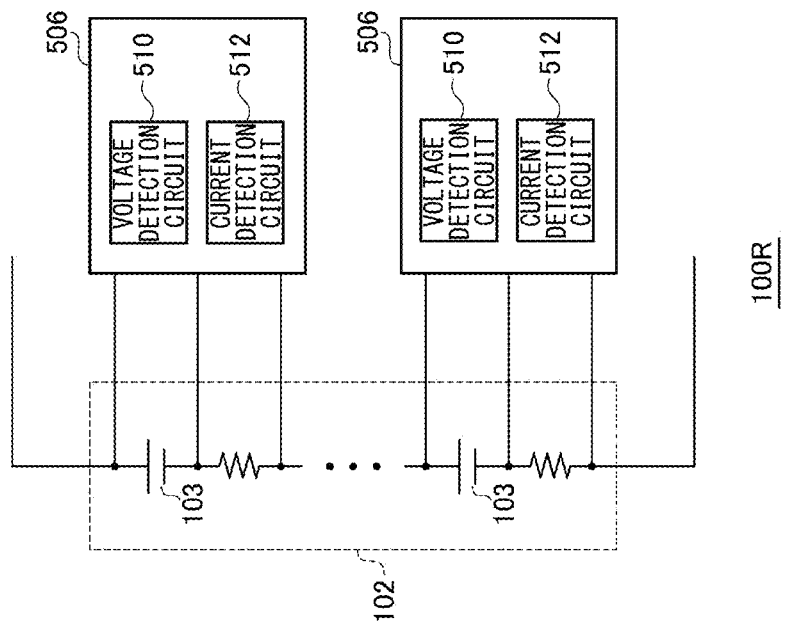

A comparison technique 100S shown in FIG. 4B has a configuration in which the current monitoring circuit 200 is omitted from the battery management system 100 shown in FIG. 2. A voltage drop (current detection signal) $V_{CS}$ that indicates the charging/discharging current $I_{BAT}$ is input to the processor 106. In many cases, a general-purpose MCU or microcomputer includes a built-in A/D converter. By inputting the current detection signal $V_{CS}$ to the A/D converter, the processor 106 detects the charging/discharging current $I_{BAT}$. With the battery management system 100S according to the comparison technique shown in FIG. 4B, the judgment of whether or not the relaxation time $\tau_{RELAX}$ has elapsed is entrusted to the processor 106. As described above, the relaxation time $\tau_{RELAX}$ has a time scale of several dozen minutes to several hours. Accordingly, in a case in which the processor 106 is entrusted with the judgment of whether or not the battery pack is in the relaxed state, the processor 106 is required to operate at all times. The processor 106 involves relatively large power consumption. Accordingly, in a state in which the operation of the processor 106 is not required, the processor 106 is preferably set to the standby (sleep) state as much as possible. However, the system 100S shown in FIG. 4B cannot provide such a function, leading to increased power consumption of the overall system.

In contrast, with the battery management system 100 shown in FIG. 2, the time measurement operation required for the judgment of whether or not the battery pack is in the relaxed state is allocated to the battery management system 100. This lightens the load of the processor 106, thereby reducing power consumption. Otherwise, this arrangement is capable of providing the sleep state. It should be noted that the current monitoring circuit 200 operates at all times in order to monitor the charging/discharging current $I_{BAT}$. Accordingly, it can be said that an increase in power consumption involved in the current monitoring circuit 200 is small.

The present invention encompasses various kinds of apparatuses and circuits that can be regarded as a block configuration or a circuit configuration shown in FIG. 2, or otherwise that can be derived from the aforementioned description. That is to say, the present invention is not restricted to a specific configuration. More specific description will be made below regarding example configurations for clarification and ease of understanding of the essence of the present invention and the circuit operation. That is to say, the following description will by no means be intended to restrict the technical scope of the present invention.

Figure 5:
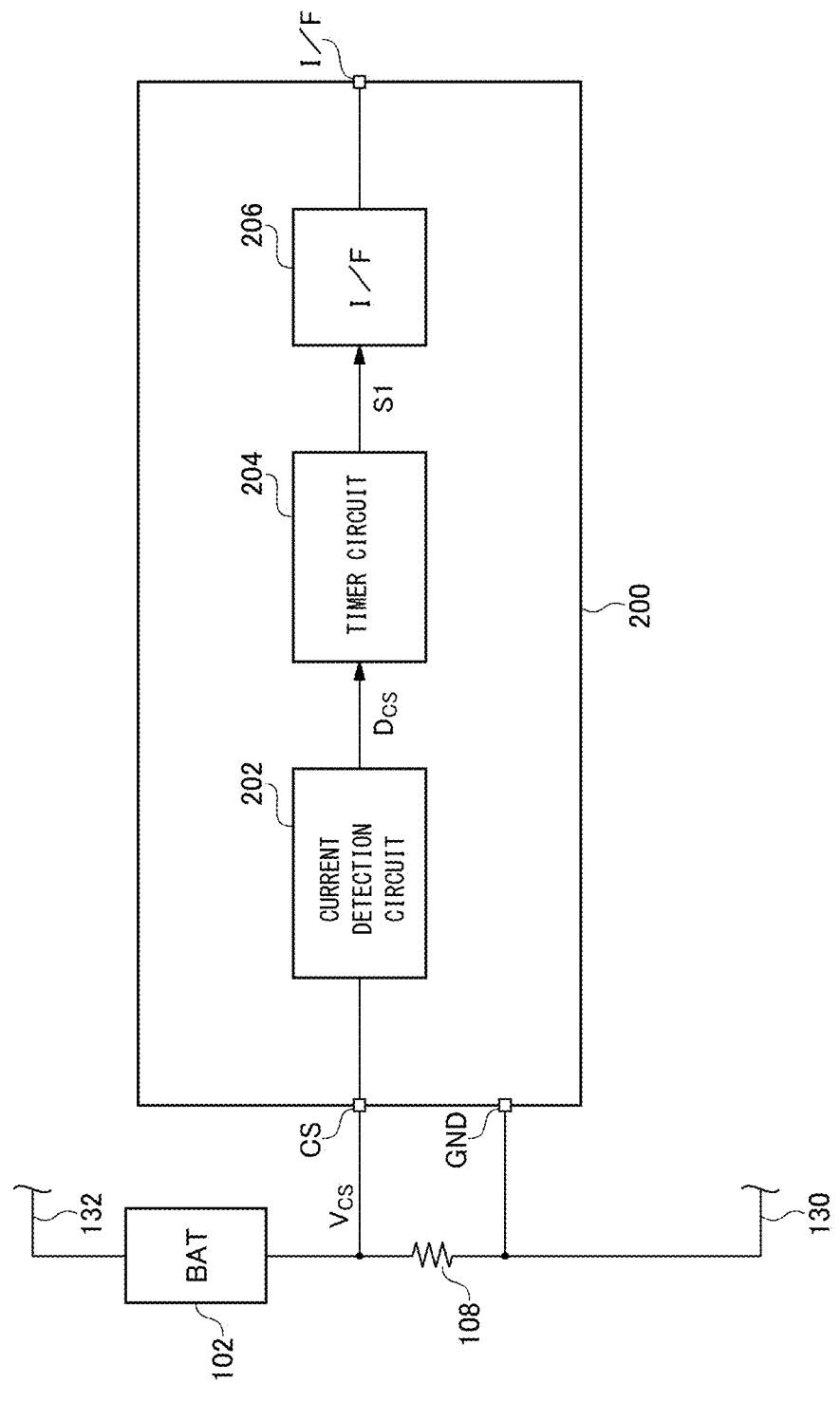
FIG. 5 is a block diagram showing a current monitoring circuit according to the first embodiment.

FIG. 5 is a block diagram showing the current monitoring circuit 200 according to the first embodiment. The current monitoring circuit 200 includes a current detection circuit 202, a timer circuit 204, and an interface circuit 206. The current detection circuit 202 detects the charging/discharging current $I_{BAT}$ that flows through the multiple cells of the battery pack 102. For example, the current detection circuit 202 may include an A/D converter that converts the current detection signal $V_{CS}$ input to the CS terminal into a digital value $D_{SC}$. Furthermore, the current detection circuit 202 may include a sensing amplifier arranged on the upstream stage of the A/D converter, and that amplifies the current detection signal $V_{CS}$. By inserting such a sensing amplifier, this arrangement allows the resistance value of the sensing resistor 108 to be reduced as compared with a case in which such a sensing amplifier is not inserted, thereby allowing power loss to be reduced.

The timer circuit 204 measures the length of a period in which the charging/discharging current $I_{BAT}$ measured by the current detection circuit 202 is lower than a predetermined threshold value. When the measurement time exceeds the judgment time $\tau_{TH}$, the timer circuit 204 asserts the detection signal S1. The interface circuit 206 notifies the processor 106 of the assertion of the detection signal S1.

It should be noted that, as described in a second embodiment, the current monitoring circuit 200 may support integration processing for the coulomb counting method.

Figure 6:
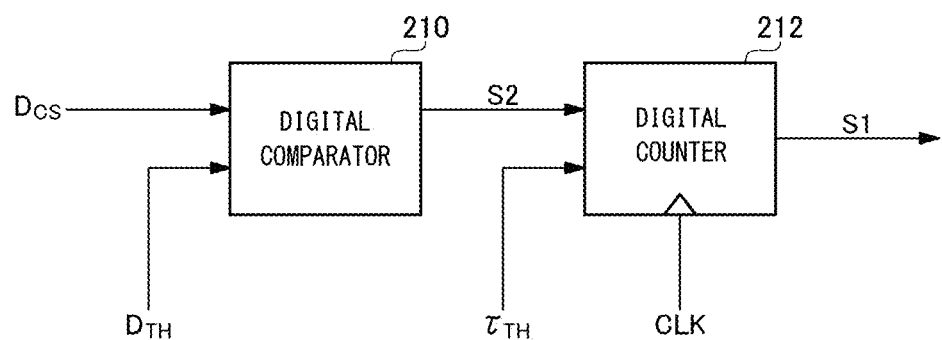
FIG. 6 is a block diagram showing an example configuration of a timer circuit.

FIG. 6 is a block diagram showing an example configuration of the timer circuit 204. The timer circuit 204 includes a digital comparator 210 and a digital counter 212. The digital comparator 210 compares the digital value $D_{CS}$ that indicates the charging/discharging current $I_{BAT}$ with a predetermined threshold value $D_{TH}$. When the output S2 of the digital comparator 210 indicates the relation $D_{CS}<D_{TH}$ (i.e., the no-load state), the digital counter 212 counts up (or otherwise counts down) according to a clock signal CLK. When the count value of the digital counter 212 reaches a setting value that corresponds to the judgment time $\tau_{TH}$, the timer circuit 204 asserts the detection signal S1 that indicates the relaxed state. For example, the bit number of the digital counter 212 may be defined according to the judgment time $\tau_{TH}$, and carrying a predetermined digit of the digital counter 212 may be associated with the assertion of the detection signal S1.

In some cases, the relaxation time $\tau_{RELAX}$ changes depending on the aging of the battery pack (SOH: State Of Health), the temperature, or the remaining battery charge (SOC). Accordingly, the current monitoring circuit 200 may change the judgment time $\tau_{TH}$ according to at least one of the aging state, the temperature, and the remaining battery charge. This allows the OCV to be measured with improved precision.

For example, the aging state is calculated by the processor 106. The algorithm or method for estimating the aging state is not restricted in particular. Rather, known techniques or techniques that will become available in the future may be employed. The processor 106 may transmit data that indicates the aging state to the current monitoring circuit 200. Also, the current monitoring circuit 200 may set the judgment time $\tau_{TH}$ based on the data thus received. Alternatively, the processor 106 may transmit data for setting the judgment time $\tau_{TH}$ to the current monitoring circuit 200.

First Modification

Figure 7:
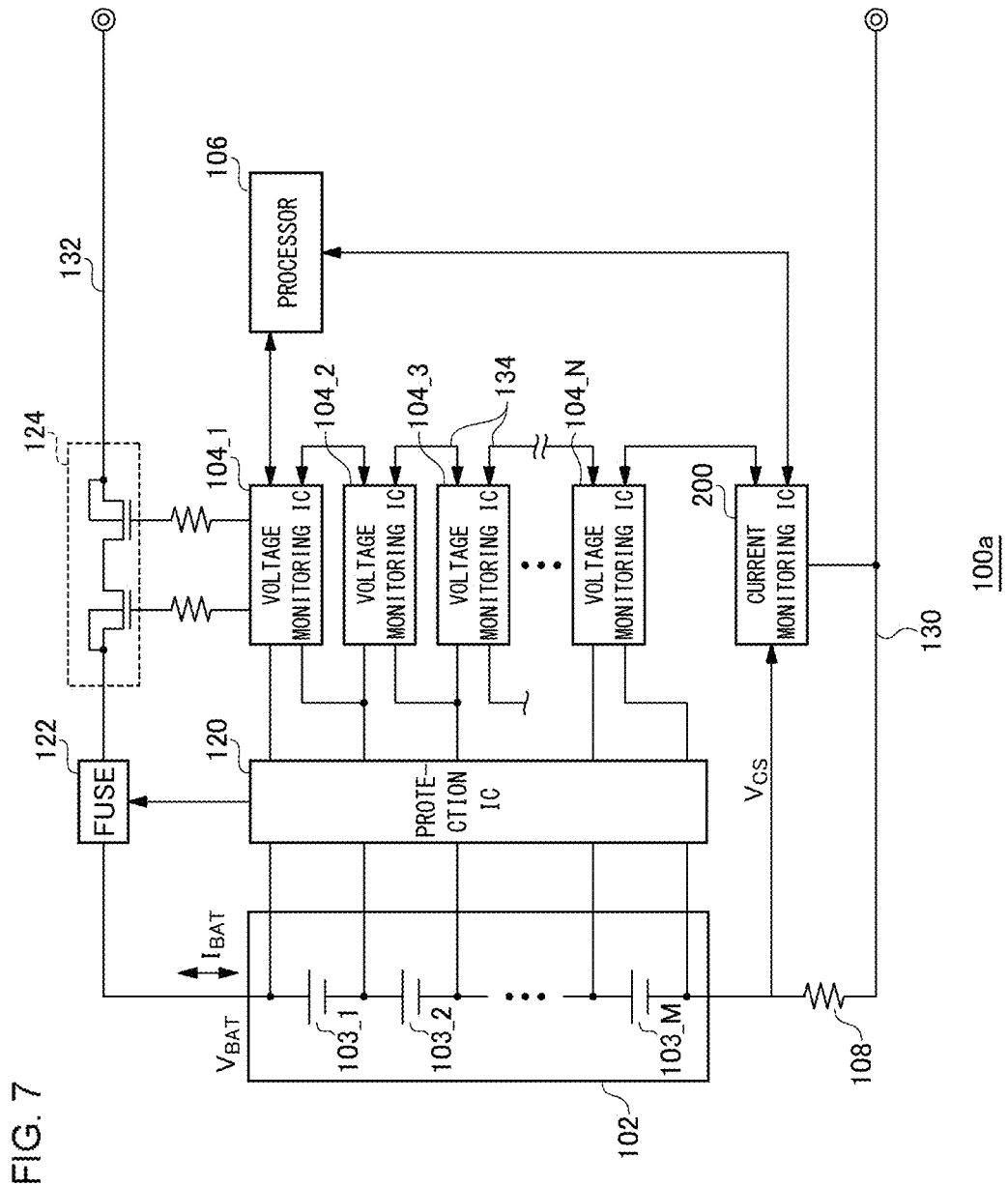
FIG. 7 is a block diagram showing a battery management system according to a first modification.

Next, description will be made regarding a modification of the first embodiment. The configuration for coupling between the voltage monitoring circuit 104, the processor 106, and the current monitoring circuit 200 is not restricted to such an arrangement shown in FIG. 2. FIG. 7 is a block diagram showing a battery management system 100a according to a first modification. With the embodiment (FIG. 2), when the current monitoring circuit 200 detects the relaxed state, first, a notice of this detection is transmitted to the processor 106. Subsequently, the processor 106 instructs each of the multiple voltage monitoring circuits 104 to measure the voltage. In contrast, with the battery management system 100a shown in FIG. 7, an instruction to measure the voltage (or otherwise the detection signal S1) is transmitted to each of the multiple voltage monitoring circuits 104 without involving the processor 106. For example, the current monitoring circuit 200 may be coupled to an extension of the cascade chain 134 in which the multiple voltage monitoring circuits 104 are coupled with each other. Also, such a voltage measurement instruction may be transmitted to the multiple voltage monitoring circuits 104 via the cascade chain 134. Alternatively, the current monitoring circuit 200 and the multiple voltage monitoring circuits 104 may be coupled via an unshown bus.

Second Modification

Also, in the modification shown in FIG. 7, the interface (wiring) that couples the processor 106 and the current monitoring circuit 200 may be omitted. Also, the communication between the processor 106 and the current monitoring circuit 200 may be conducted via the cascade chain 134.

Third Modification

Also, in another modification, the multiple voltage monitoring circuits 104, the processor 106, and the current monitoring circuit 200 may be coupled via a single bus.

Second Embodiment

Figure 8:
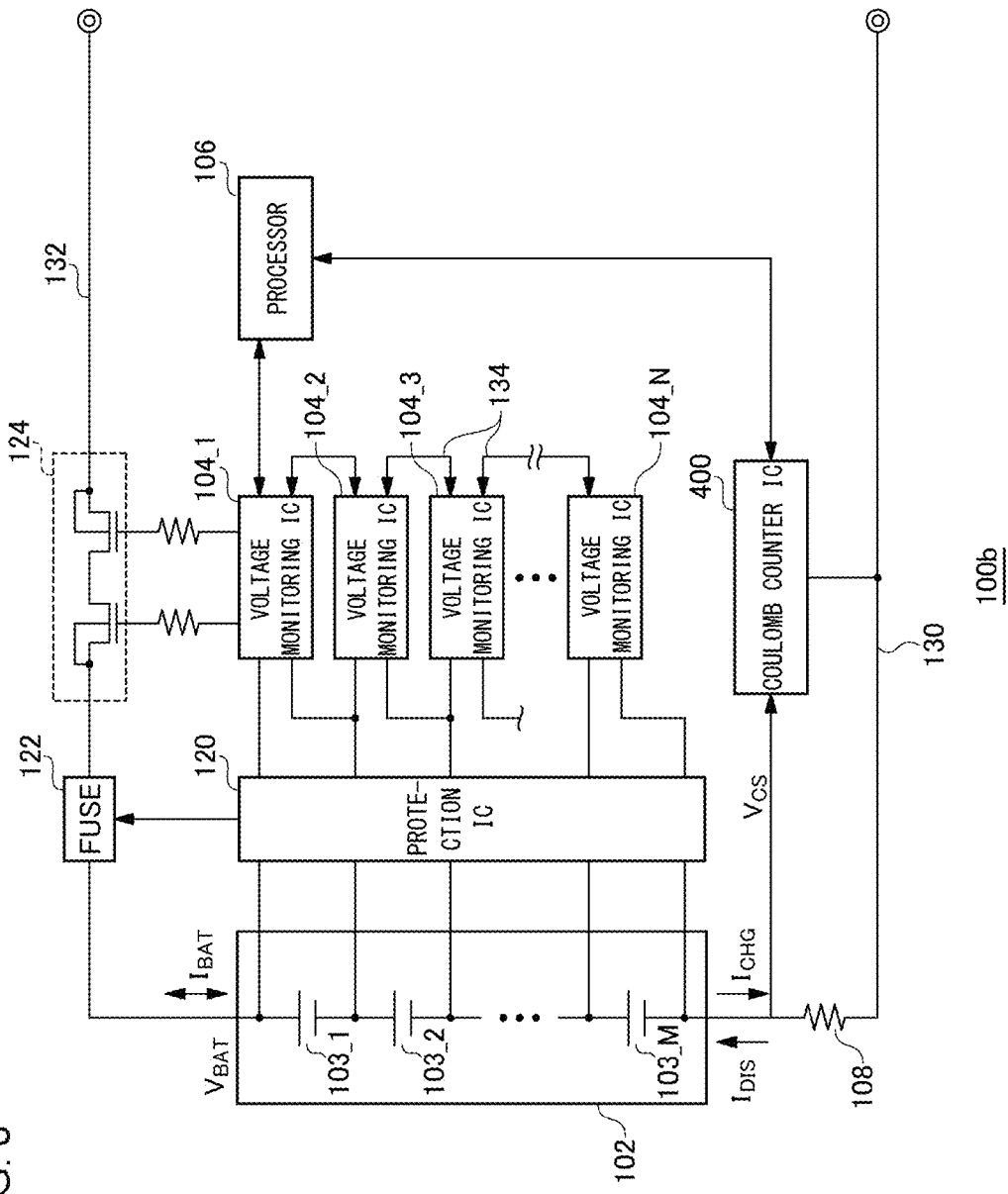
FIG. 8 is a block diagram showing a battery management system according to a second embodiment.

FIG. 8 is a block diagram showing a battery management system 100b according to a second embodiment. The battery management system 100b includes a coulomb counter circuit 400 instead of the current monitoring circuit 200 of the battery management system 100 shown in FIG. 2.

The coulomb counter circuit 400 has a function of detecting the charging/discharging current $I_{BAT}$ that flows through the multiple cells 103 in the same manner as the current monitoring circuit 200. Furthermore, as a part of the coulomb counting calculation processing, the coulomb counter circuit 400 accumulates the charging/discharging current $I_{BAT}$ with the charging current as a positive current and with the discharging current as a negative current ("positive" and "negative" may be exchanged), so as to generate the accumulation coulomb count value (ACC value). The ACC value is read out by the processor 106, and is used to calculate the SOC.

In a case in which the processor 106 executes the current integration calculation processing, the processor 106 is required to operate during a period in which the SOC is detected using the coulomb counting method. This becomes a large restriction in designing the control sequence for the processor 106 in a case in which the processor 106 operates on a software basis. In contrast, with the second embodiment, by implementing the coulomb counting function on the coulomb counter circuit 400 (current monitoring circuit 200), this arrangement allows a longer sleep state period to be provided for the processor 106, thereby allowing power consumption to be further reduced.

Furthermore, the coulomb counter circuit 400 generates the charge coulomb count value (CCC value) configured as an accumulated value of the charging current $I_{CHG}$ that flows to the multiple cells 103 and the discharge coulomb count value (DCC value) configured as an accumulated value of the discharging current $I_{DIS}$ that flows from the multiple cells 103. For example, the charging current $I_{CHG}$ is measured in the form of a positive voltage drop $V_{CS}$. The discharging current $I_{DIS}$ is measured in the form of a negative voltage drop $V_{CS}$.

The CCC value and the DCC value measured by the coulomb counter circuit 400 are transmitted to the processor 106 together with the ACC value. The processor 106 calculates the number of charging cycles ($=CCC/Q_{MAX}$) based on the CCC value, and calculates the number of discharging cycles ($=DCC/Q_{MAX}$) based on the DCC value. Here, $Q_{MAX}$ represents the amount of charge that corresponds to the rated capacity of the battery pack 102.

Furthermore, by measuring the CCC value and the DCC value, this arrangement is capable of acquiring the number of charging/discharging cycles. When the number of charging cycles and the number of discharging cycles are both incremented by 1, the number of charging/discharging cycles is incremented by 1.

The calculation of the CCC value and the DCC value requires the current integration processing. However, in a case in which such current integration processing is executed by the processor 106, this arrangement is required to operate the processor 106 at all times. This becomes a large restriction in designing the control sequence for the processor 106 in a case in which the processor 106 operates on a software basis. By further implementing the CCC value calculation function and the DCC value calculation function on the coulomb counter circuit 400 (current monitoring circuit 200), this arrangement allows a longer sleep state period to be provided for the processor 106, thereby allowing power consumption to be further reduced.

Figure 9:
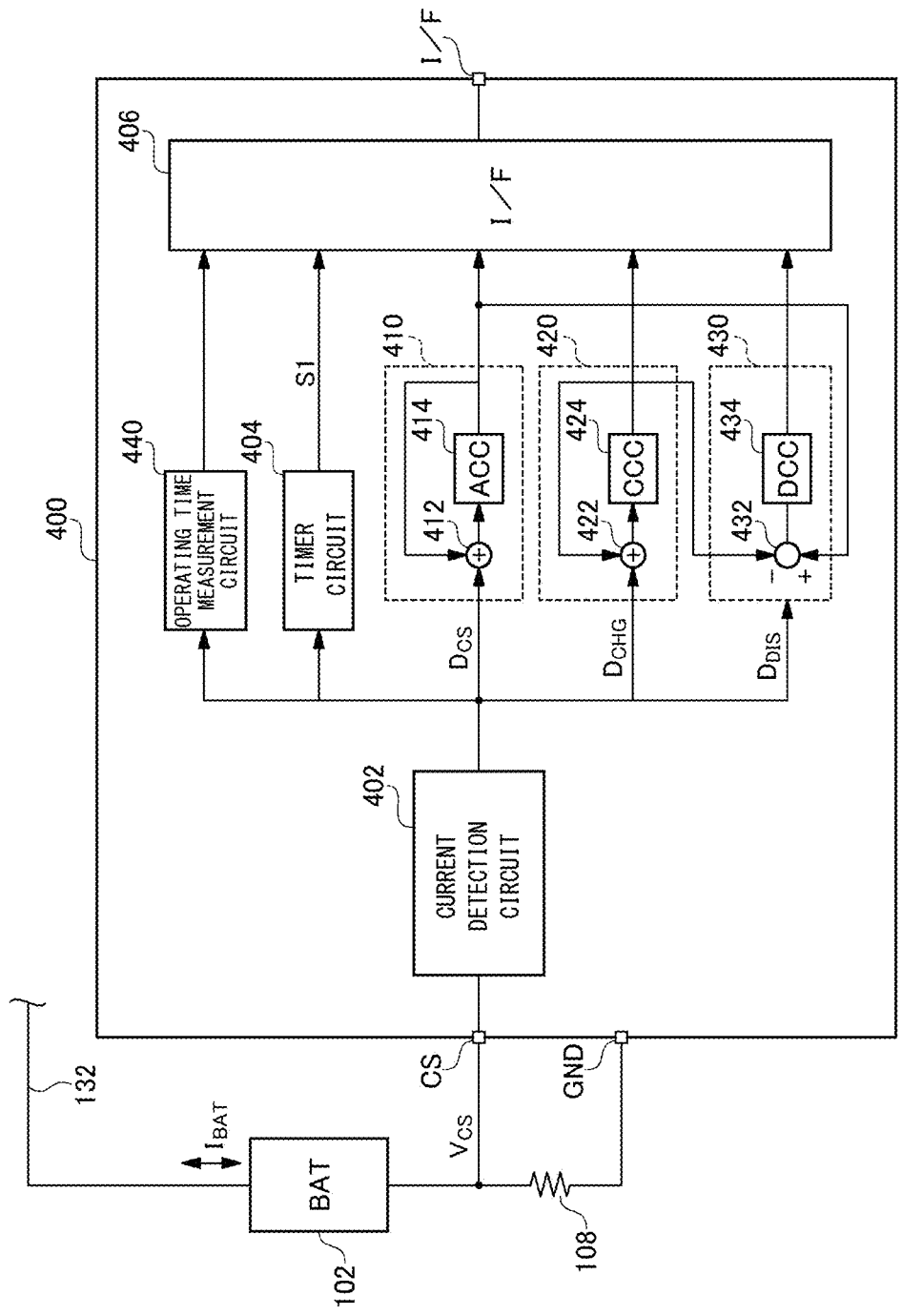
FIG. 9 is a block diagram showing a coulomb counter circuit according to the second embodiment.

FIG. 9 is a block diagram showing the coulomb counter circuit 400 according to the second embodiment. A current detection circuit 402, a timer circuit 404, and an interface circuit 406 correspond to the current detection circuit 202, the timer circuit 404, and the interface circuit 206 shown in FIG. 5, respectively. It should be noted that the timer circuit 404 may be omitted.

The positive value of the output $D_{CS}$ of the current detection circuit 402, which represents the charging current $I_{CHG}$, will be represented by $D_{CHG}$, and the negative value, which represents the discharging current $I_{DIS}$, will be represented by $D_{DIS}$.

A first counter circuit 410 accumulates the charging current $I_{CHG}$ and the discharging current $I_{DIS}$ detected by the current detection circuit 402 assuming that they have opposite polarities, so as to generate the ACC value. For example, the first counter circuit 410 may be configured as an accumulator (integrator) that accumulates the current detection value $D_{CS}$ with the charging current $I_{CHG}$ as a positive current and with the discharging current $I_{DIS}$ as a negative current. The first counter circuit 410 includes an adder 412 and an ACC register 414. The ACC register 414 stores the ACC value. The adder 412 adds the updated current detection value $D_{CS}$ to the value stored in the ACC register 414, so as to generate an updated ACC value. The updated ACC value thus generated is stored in the ACC register 414.

A second counter circuit 420 accumulates the charging current $I_{CHG}$ detected by the current detection circuit 402, so as to generate the CCC value. For example, the second counter circuit 420 may be configured as an accumulator (integrator) that accumulates the charging current detection value $D_{CHG}$ that corresponds to the charging current $I_{CHG}$. The second counter circuit 420 includes an adder 422 and a CCC register 424. The CCC register 424 stores the CCC value. The adder 422 adds the updated charging current detection value $D_{CHG}$ to the value stored in the CCC register 424, so as to generate an updated CCC value. The updated CCC value is stored in the CCC register 424.

Figure 10:
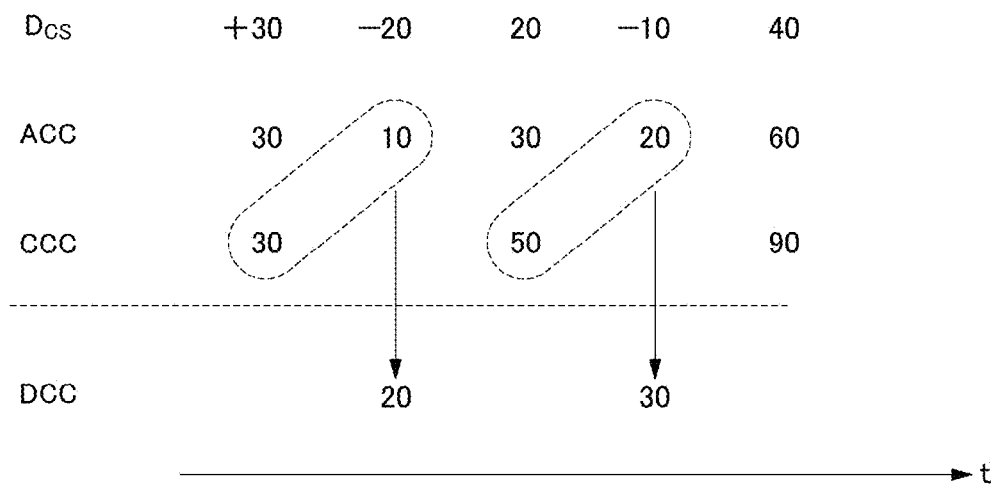
FIG. 10 is a diagram showing the histories of the ACC value, the CCC value, and the DCC value.

FIG. 10 is a diagram showing the histories of the ACC value, the CCC value, and the DCC value. As can be understood from FIG. 10, in a case in which the ACC value and the immediately previous value of the CCC value are known, the DCC value can be acquired by calculation. Accordingly, a third counter circuit 430 shown in FIG. 9 generates the DCC value based on the difference between the ACC value and the CCC value. The third counter circuit 430 includes a subtractor 432 and a DCC register 434. When the charging current detection value $D_{DIS}$ thus generated is not zero, the third counter circuit 430 operates. In this case, the subtractor 432 subtracts the CCC value from the ACC value so as to generate the DCC value. The DCC value thus obtained is stored in the DCC register 434.

It should be noted that the third counter circuit 430 has the same configuration as that of the second counter circuit 420 in which the discharging current detection value $D_{DIS}$ that corresponds to the discharging current $I_{DIS}$ is accumulated.

It should be noted that, in a case in which the coulomb counter circuit 400 does not have sufficient resources to allow the third counter circuit 430 to be configured as a hardware component, the third counter circuit 430 may be omitted. In this case, the DCC value may be calculated by means of a software control operation of the processor 106. This allows the coulomb counter circuit 400 to have a reduced size.

Conversely, the DCC value may be calculated by means of a hardware component in the coulomb counter circuit 400, and the CCC value may be calculated in a software manner by means of the processor 106. In this case, the CCC value may be calculated by subtracting the DCC value from the ACC value.

It should be noted that the ACC value changes between zero and a maximum value that corresponds to the rated capacity of the battery. Accordingly, the bit number of the ACC register 414 may be determined according to the rated capacity. In contrast, the CCC value and DCC value can each can rise without an upper limit. Accordingly, the CCC register 424 and the DCC register 434 may each be designed to have a sufficiently large bit number so as to prevent the occurrence of overflow in the register. As the bit number is increased, this allows the processor 106 to be provided with an increased sleep time. However, this leads to an increase in the circuit scale of the second counter circuit 420 or the third counter circuit 430. In a case in which a sufficient bit number cannot be provided due to a restriction in the circuit area, the processor 106 may read out the values stored in the CCC register 424 and the DCC register 434 by means of a software control operation before the occurrence of overflow, and may reset the CCC register 424 and the DCC register 434 for every readout operation. Alternatively, when there is a possibility of register overflow, the coulomb counter circuit 400 may issue an interrupt signal to the processor 106, so as to instruct the processor 106 to read out the CCC value and the DCC value stored in the registers.

The coulomb counter circuit 400 shown in FIG. 9 further includes an operating time measurement circuit 440. The operating time measurement circuit 440 measures the accumulated operating time of the battery pack 102. Any one of (1) the sum total of the time during which the charging/discharging current $I_{BAT}$ is not zero, (2) the sum total of the time during which the charging/discharging current $I_{BAT}$ is zero, and (3) the sum total of the time during which the charging/discharging current Ism is not zero and the time during which the charging/discharging current $I_{BAT}$ is zero can be employed as the accumulated operating time. In a case of employing (1), the accumulated operating time (which will be referred to as the "cycle aging time" hereafter) has a correspondence with the cycle aging or otherwise represents the cycle aging. In a case of employing (2), the accumulated operating time (which will be refereed to as the "storage aging time" hereafter) has a correspondence with the storage aging or otherwise represents the storage aging. In a case of employing (3), the accumulated operating time (which will be referred to as the "total aging time" hereafter) is the sum total of the cycle aging time and the storage aging time, and has a correspondence with both the cycle aging and the storage aging. The operating time measurement circuit 440 may separately measure the multiple times from among the accumulated operating times defined in (1) through (3).

The accumulated operating time thus measured is used to estimate the aging state (SOH) of the battery pack 102. This allows the rated capacity of the battery pack 102 to be corrected based on the SOH. The hardware component for the time measurement operation of the operating time measurement circuit 440 may be shared with the hardware component for the time measurement operation of the timer circuit 404. In a case in which the accumulated operating time is measured by the processor 106 in a software manner, the processor 106 cannot be provided with a sleep state. In contrast, in a case in which the operating time is measured by the coulomb counter circuit 400, this arrangement allows the processor 106 to be provided with a sleep state.

The operating time measurement circuit 440 preferably counts with a weighting coefficient that corresponds to the remaining battery charge (SOC) of the battery pack 102.

With $t_i = i \times \Delta t$, with $i = 1, 2, \ldots$, and with $\Delta t$ as the unit of time for counting, the SOC at each time point ti is represented by $SOC(t_i)$. The coefficient Ki at a given time point is represented by $f(SOC_i)$. Here, f( ) represents a function that represents the relation between the SOC and the coefficient K. The accumulated operating time T is represented by the following Expression (1).

$$T = \Sigma_{i=1 \sim N}(\Delta t \times K_i) = \Sigma_{i=1 \sim N}(\Delta t \times f(SOC_i)) \tag{1}$$

Figure 11:
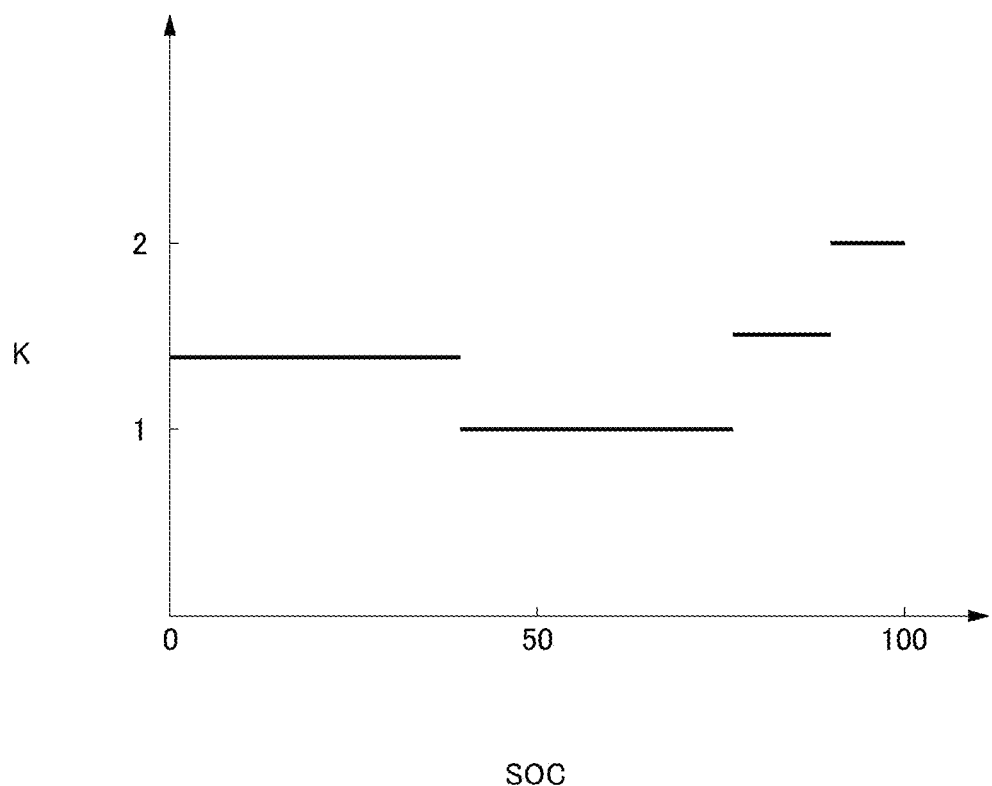
FIG. 11 is a diagram showing the relation between the SOC and the coefficient K.

For example, when 90%<SOC, K may be set to 2. When 80%<SOC≤90%, K may be set to 1.5. When 40%<SOC≤80%, K may be set to 1.0. When 0%<SOC≤40%, K may be set to 1.2. FIG. 11 is a diagram showing the relation between the SOC and the coefficient K. The coefficient K is represented by lines that form a downwardly convex shape. By giving consideration to the SOC, the aging of the battery (SOH) can be estimated with high precision. Such improved estimation precision for the SOH provides improved estimation precision for the SOC.

In a case in which both the cycle aging time $T_1$ and the storage aging time $T_2$ are measured, different coefficients may be employed for the respective measurements.

$$T_1 = \Sigma_{i=1 \sim N}(\Delta t \times f_1(SOC_i))$$

$$T_2 = \Sigma_{i=1 \sim N}(\Delta t \times f_2(SOC_i))$$

Here, $f_1$ represents a function that represents the relation between the SOC and the coefficient K with respect to the cycle aging time $T_1$. On the other hand, $f_2$ represents a function that represents the relation between the SOC and the coefficient K with respect to the storage aging time $T_2$.

It should be noted that the coefficient K may be represented by a function that corresponds to the temperature T in addition to the SOC.

$$K = f(SOC, T)$$

Here, the coefficient K may be represented by a function that corresponds to the temperature T.

$$K = f(T)$$

By giving consideration to the temperature T, aging of the battery can be estimated with high precision.

Next, description will be made regarding a modification of the second embodiment. As described in the modification of the first embodiment, the configuration for coupling the coulomb counter circuit 400, the processor 106, and the voltage monitoring circuit 104 is not restricted in particular. Any desired features described in the first embodiment can be supported by the second embodiment. Also, any desired features described in the second embodiment can be supported by the first embodiment.

Figure 12:
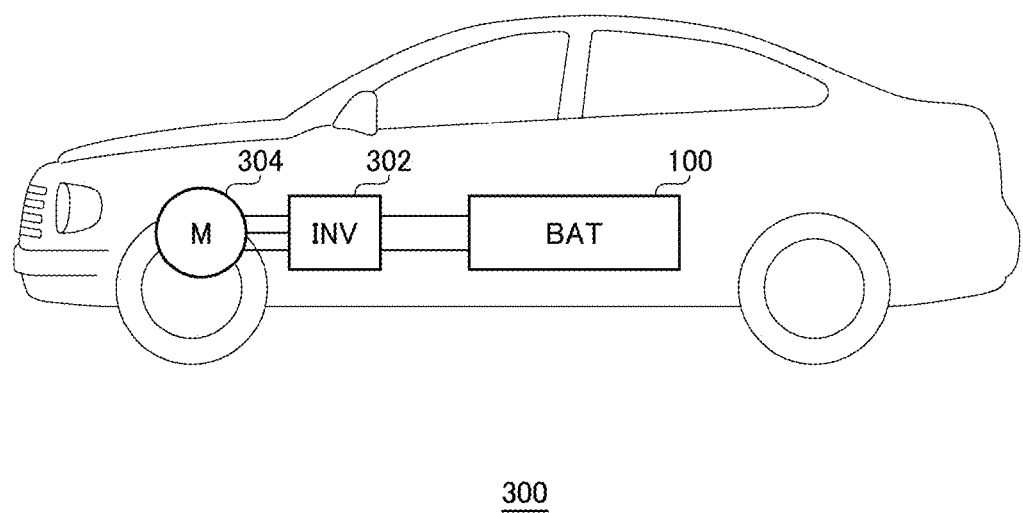
FIG. 12 is a diagram showing a vehicle including a battery management system.

Lastly, description will be made regarding the usage of the battery management system 100. FIG. 12 is a diagram showing a vehicle 300 including the battery management system 100. The vehicle 300 is configured as an electric vehicle (EV), a plug-in hybrid vehicle (PHV), a hybrid vehicle (HV), or the like. An inverter 302 receives the voltage $V_{BAT}$ from the battery management system 100, converts the received voltage into an AC voltage, and supplies the AC voltage thus converted to a motor 304, thereby rotationally driving the motor 304. When the vehicle is decelerated by pressing the brake pedal or the like, the inverter 302 regenerates electric power. In this case, the current generated by the motor 304 is stored in the battery pack 102 of the battery management system 100. In addition, PHVs and EVs are each provided with a charger circuit that charges the battery pack 102 of the battery management system 100.

With the vehicle 300, electric power is regenerated in a short time scale of 1 second or less accompanying braking. In this case, the charging current flows in a very short period of time of 1 second or less. Also, in some case, a large discharging current flows in a very short period of time of 1 second or less accompanying quick acceleration. In a case in which the relaxed state is monitored by the processor 106 as with the battery management system 100S shown in FIG. 4A and FIG. 4B, the charging/discharging current is measured at a sampling rate on the order of at most 1 Hz from the viewpoint of software and power consumption. Such an arrangement is not capable of detecting a regenerated current (charging current) or a discharging current that occurs in a short period of time. In this case, false judgment is made that the battery pack is in the no-load state even if the battery pack is not in the no-load state, leading to poor precision in the relaxed state judgment. In contrast, with the battery management system 100 according to the embodiment, this arrangement is capable of sampling the charging/discharging current with a high frequency of several dozen Hz to several kHz, thereby providing improved precision in the relaxed state judgement.

Similarly, in a case in which the coulomb counting processing is supported by the software control operation of the processor 106, the charging/discharging current is measured at a sampling rate on the order of at most 1 Hz. Such an arrangement is not capable of detecting a regenerated current (charging current) that occurs in a short period of time, and is not capable of detecting a very large discharging current. This leads to a problem of increased error in the measurement of the ACC value, the CCC value, and the DCC value. In contrast, the battery management system 100a according to the embodiment is capable of sampling the charging/discharging current with a high frequency of several dozen Hz to several kHz, thereby providing improved precision in the coulomb counting processing by the coulomb counter circuit 400.

In addition, the battery management system 100 may be applied to industrial equipment, industrial apparatuses, household/factory electricity storage systems, power supplies for elevator systems, etc.

While the preferred embodiments of the present invention have been described using specific terms, such description is for illustrative purposes only, and it is to be understood that changes and variations may be made without departing from the spirit or scope of the appended claims.

What is claimed is:

1. A battery management system comprising:
a battery pack comprising a plurality of cells;
a plurality of voltage monitoring circuits each structured to detect a voltage across at least one corresponding cell from among the plurality of cells; and
a current monitoring circuit structured to detect a current that flows through the plurality of cells,
when a length of a period during which the current that flows through the plurality of cells is zero exceeds a predetermined judgment time, the current monitoring circuit asserts a detection signal,
and wherein, upon detecting an assertion of the detection signal, each voltage monitoring circuit measures the voltage across at least one corresponding cell,
and wherein the current monitoring circuit comprises:
a current detection circuit structured to measure the current that flows through the plurality of cells; and
a timer circuit structured to measure a length of time during which a digital value indicative of a current measured by the current detection circuit is lower than a predetermined threshold value,
and wherein the timer circuit includes:
a digital comparator structured to compare the digital value with the predetermined threshold value;
a digital timer structured to count a clock signal when an output of the digital comparator indicates that the digital value is smaller than the predetermined threshold value, and to assert the detection signal when the count value of the digital counter reaches a setting value that corresponds to the judgment time.

2. The battery management system according to claim 1, wherein the current monitoring circuit notifies the plurality of voltage monitoring circuits of the assertion of the detection signal.

3. The battery management system according to claim 1, further comprising a processor,
wherein the current monitoring circuit notifies the processor of the assertion of the detection signal,
wherein, upon reception of the notice from the current monitoring circuit, the processor instructs the plurality of voltage monitoring circuits to measure a voltage.

4. The battery management system according to claim 1, wherein the judgment time is variable according to an aging state of the battery pack.

5. The battery management system according to claim 1, wherein the judgment time is variable according to a temperature of the battery pack.

6. The battery management system according to claim 1, wherein the judgment time is variable according to a state of charge of the battery pack.

7. The battery management system according to claim 1, wherein the current monitoring circuit further comprises a counter circuit structured to accumulate the current that flows through the plurality of cells.

8. A current monitoring circuit to be used for a battery management system, wherein the battery management system comprises:
a battery pack comprising a plurality of cells;

a plurality of voltage monitoring circuits each structured to detect a voltage across at least one corresponding cell from among the plurality of cells; and
a current monitoring circuit structured to detect a current that flows through the plurality of cells,
wherein the current monitoring circuit comprises:
a current detection circuit structured to measure the current that flows through the plurality of cells; and
a timer circuit structured to measure a length of a period during which the current measured by the current detection circuit is zero,
wherein, when the period of time measured by the timer circuit exceeds a predetermined judgment time, the current monitoring circuit asserts a detection signal that indicates that the plurality of cells are in a relaxed state,
and wherein, upon detecting an assertion of the detection signal, each voltage monitoring circuit measures the voltage across at least one corresponding cell,
and wherein the timer circuit is structured to measure a length of time during which a digital value indicative of a current measured by the current detection circuit is lower than a predetermined threshold value,
and wherein the timer circuit includes:
a digital comparator structured to compare the digital value with the predetermined threshold value;
a digital timer structured to count a clock signal when an output of the digital comparator indicates that the digital value is smaller than the predetermined threshold value, and to assert the detection signal when the count value of the digital counter reaches a setting value that corresponds to the judgment time.

9. The current monitoring circuit according to claim 8, wherein the battery management system further comprises a processor,
wherein the current monitoring circuit further comprises an interface circuit structured to transmit and receive data to and from the processor,
and wherein the current monitoring circuit is structured to transmit the detection signal to the processor via the interface circuit.

10. The current monitoring circuit according to claim 8, wherein the current monitoring circuit further comprises an interface circuit structured to transmit and receive data to and from the plurality of voltage monitoring circuits,
and wherein the current monitoring circuit transmits the detection signal to the plurality of voltage monitoring circuits via the interface circuit.

11. The current monitoring circuit according to claim 8, wherein the judgment time is variable according to an aging state of the battery pack.

12. The current monitoring circuit according to claim 8, wherein the judgment time is variable according to a temperature of the battery pack.

13. The current monitoring circuit according to claim 8, wherein the judgment time is variable according to a state of charge of the battery pack.

14. The current monitoring circuit according to claim 8, further comprising a counter circuit structured to accumulate the current that flows through the plurality of cells.

15. A battery management system comprising the current monitoring circuit according to claim 8.

\* \* \* \* \*